US012318871B2

(12) United States Patent
Martensson et al.

(10) Patent No.: US 12,318,871 B2
(45) Date of Patent: Jun. 3, 2025

(54) METHOD FOR CONTROLLING AN EJECTOR, AND RELATED SYSTEM

(71) Applicant: Mycronic AB, Taby (SE)

(72) Inventors: Gustaf Martensson, Solna (SE); Pontus Forsberg, Taby (SE)

(73) Assignee: Mycronic AB, Taby (SE)

( * ) Notice: Subject to any disclaimer, the term of this patent is extended or adjusted under 35 U.S.C. 154(b) by 945 days.

(21) Appl. No.: 17/414,266

(22) PCT Filed: Dec. 13, 2019

(86) PCT No.: PCT/EP2019/085015
§ 371 (c)(1),
(2) Date: Jun. 15, 2021

(87) PCT Pub. No.: WO2020/126874
PCT Pub. Date: Jun. 25, 2020

(65) Prior Publication Data

US 2022/0040776 A1 Feb. 10, 2022

(30) Foreign Application Priority Data

Dec. 21, 2018 (SE) .................................. 1851653-4

(51) Int. Cl.
*B23K 3/08* (2006.01)
*B23K 1/00* (2006.01)
(Continued)

(52) U.S. Cl.
CPC .............. *B23K 3/08* (2013.01); *B23K 1/0016* (2013.01); *B23K 3/0638* (2013.01); *H05K 3/125* (2013.01);
(Continued)

(58) Field of Classification Search
CPC ...... B23K 3/08; B23K 1/0016; B23K 3/0638; B23K 2101/36; H05K 3/125;
(Continued)

(56) References Cited

U.S. PATENT DOCUMENTS 5,747,102 A * 5/1998 Smith .................. G01F 13/006
228/102
9,398,697 B2 * 7/2016 Martensson .......... B05C 5/0225
(Continued)

FOREIGN PATENT DOCUMENTS

CN 103389600 A 11/2013
EP 1760123 A2 3/2007
(Continued)

OTHER PUBLICATIONS

International Search Report PCT/ISA/210 for International Application No. PCT/EP2019/085015 Dated Apr. 25, 2020.

*Primary Examiner* — Bob Zadeh
(74) *Attorney, Agent, or Firm* — Harness, Dickey & Pierce, P.L.C.

(57) ABSTRACT

A method for controlling an ejector is disclosed, wherein the ejector comprises an actuator arrangement configured to eject a droplet of viscous medium onto a substrate, and wherein the droplet forms part of a sequence of a plurality of droplets. The method comprises obtaining a control parameter for controlling the operation of the actuator arrangement, and operating the actuator arrangement, using the control parameter, in order to eject the droplet. The obtained control parameter is based on at least one of: a time period between the droplet and a previous droplet in the sequence, a difference in target size of the droplet and a size of the previous droplet in the sequence, and the droplets position in the sequence.

15 Claims, 3 Drawing Sheets

(51) Int. Cl.
  *B23K 3/06* (2006.01)
  *H05K 3/12* (2006.01)
  *H05K 3/34* (2006.01)
  *B23K 101/36* (2006.01)

(52) U.S. Cl.
  CPC ........ H05K 3/3485 (2020.08); *B23K 2101/36* (2018.08)

(58) Field of Classification Search
  CPC ................. H05K 3/3485; H05K 3/305; H05K 2203/013; B05C 11/1005; B05C 11/1013; B05C 5/0225; B05C 11/1034
  See application file for complete search history.

(56) References Cited

U.S. PATENT DOCUMENTS

| | | | |
|---|---|---|---|
| 11,040,531 B2* | 6/2021 | Martensson | B05C 11/1034 |
| 2002/0005429 A1* | 1/2002 | Lee | B22F 9/08 228/104 |
| 2005/0167519 A1* | 8/2005 | Holm | B05B 17/0607 239/4 |
| 2006/0029724 A1 | 2/2006 | Babiarz et al. | |
| 2007/0145164 A1* | 6/2007 | Ahmadi | B05C 5/0275 239/562 |
| 2009/0115825 A1* | 5/2009 | Peng | B41J 2/04 347/92 |
| 2013/0113863 A1 | 5/2013 | Kodama et al. | |
| 2014/0262012 A1 | 9/2014 | Martenson et al. | |
| 2015/0274371 A1 | 10/2015 | Fliess et al. | |
| 2016/0031030 A1* | 2/2016 | Bergström | H05K 3/3489 118/697 |
| 2017/0182578 A1* | 6/2017 | Bergstrom | B05C 11/1034 |
| 2022/0040776 A1* | 2/2022 | Martensson | B23K 3/0638 |

FOREIGN PATENT DOCUMENTS

| | | | |
|---|---|---|---|
| JP | H10128217 A | | 5/1998 |
| JP | 2018008271 | * | 1/2018 |
| JP | 2018008271 A | | 1/2018 |
| WO | WO-96/09121 A1 | | 3/1996 |

\* cited by examiner

METHOD FOR CONTROLLING AN EJECTOR, AND RELATED SYSTEM

CROSS-REFERENCE TO RELATED APPLICATIONS

This application is a national phase under 35 U.S.C. § 371 of PCT International Application No. PCT/EP2019/085015 which has an International filing date of Dec. 13, 2019, which claims priority to Swedish Patent Application No. 1851653-4, filed Dec. 21, 2018, the entire contents of each of which are hereby incorporated by reference.

TECHNICAL FIELD

The inventive concept described herein generally relates to jetting of viscous medium onto a substrate. In particular, it relates to a system comprising an ejector and a method for controlling an ejector.

BACKGROUND

Ejectors and methods are known in the art for jetting droplets of viscous medium or fluid, e.g. solder paste, flux or adhesive, onto a substrate such as a printed wiring board (PWB), thus forming deposits that e.g. may be used for connecting electric components to the substrate. Such an ejector generally comprises a chamber for accommodating a volume of the viscous medium prior to the jetting thereof, a jetting nozzle communicating with the nozzle space, and an impacting device for impacting and jetting the viscous medium from the chamber through the nozzle in the form of droplets. Further, a feeder may be utilized to feed the medium into the nozzle space. The amount, or volume, of the deposited viscous medium at different locations on the substrate may be varied by applying several droplets on top of each other, thus forming a larger deposit, or by varying the volume of the jetted droplet by e.g. feeding a larger or smaller volume of the viscous medium into the chamber.

High production accuracy and reliability are factors of interest in manufacturing of e.g. printed circuit board (PCB) assemblies. In particular, the reliability, e.g. the accuracy and the repeatability of the jetting process is of interest due to its effects on the performance and the quality of the final product, e.g. the PCB assembly. Too small volumes of deposited medium or poorly shaped or positioned deposits may e.g. lead to dry joints or loosening components, whereas too large volumes of deposited medium may lead to short-circuiting caused by e.g. solder balls, or defective contacts due to contamination of adhesive or underfill. To increase process reliability and performance, an improved control of the application of the deposited medium is desirable.

SUMMARY OF THE INVENTION

It is an object of the present inventive concept to mitigate, alleviate or eliminate one or more of the above-identified deficiencies in the art and disadvantages singly or in combination.

According to a first aspect of the inventive concept, these and other objects are achieved in full, or at least in part, by a method for controlling an ejector comprising an actuator arrangement configured to eject a droplet of viscous medium onto a substrate, wherein the droplet forms part of a sequence of a plurality of droplets. The method comprises the steps of: obtaining a control parameter for controlling the operation of the actuator arrangement, and operating the actuator arrangement, using the control parameter, in order to eject the droplet. The obtained control parameter is based on at least one of: a time period between the droplet and a previous droplet in the sequence, a difference in target size of the droplet and a size of the previous droplet in the sequence, and the droplet's position in the sequence.

The present inventive concept is based on the realization that the resulting size of a deposit of viscous medium is dependent on, inter alia, parameters such as volume, shape, and speed of the droplet that is ejected from the ejector. These parameters are in turn affected by the rheological characteristics of the viscous medium, such as e.g. overall viscosity, shear thinning properties, and thixotropy. By taking such rheological characteristics into account when operating the actuator arrangement, an improved control over the quality of the deposit may be achieved.

The application of shear stress is an example of a factor that affects the rheological behaviour of the viscous medium, and in particular the viscosity. A low viscosity may facilitate transporting and pumping within the ejector, whereas a higher viscosity may facilitate droplet formation. As the viscous medium is subject to considerably varying shear rates during the jetting process, different rheological regimes may apply during different stages of the jetting process. From one point of view, it is advantageous if the viscous medium is shear thinning at relatively low shear rates, such as e.g. below 100 s⁻, to facilitate pumping and feeding the viscous medium to the chamber. From another point of view, it may be advantageous if the viscous medium is shear thickening at relatively high shear rates, such as e.g. above 100.000 $s^{-1}$, to promote the formation of jetted droplets of well-defined shape and/or volume and prevent deformation or spraying when leaving a nozzle and/or upon impact on the substrate. The shear thickening of the viscous medium may thus be determined or at least affected by the movement of the impacting device (and thus the varying shear rate). The rheological behaviour of the viscous medium may in particular depend on e.g. the strength of the impact, the acceleration and the length of the stroke of the actuator arrangement. Increasing the speed and/or acceleration of the movement may e.g. result in an increased viscosity (or shear thickening) of the viscous medium, whereas a reduced speed and/or acceleration may lead to a reduced viscosity of the viscous medium. Thus, previously formed deposits which are a result of previously ejected viscous medium, may be utilized to indirectly gain knowledge pertaining to the rheological characteristics of the viscous medium to be ejected. Such knowledge may be utilized to achieve an improved control over the size of the deposit.

Thixotropy is another factor that affects the jetting process. Thixotropy may be understood as a time-dependent shear thinning or shear thickening property. The rheological behaviour may hence be considered to have a 'memory', in which previous rheological states and shearing states are memorized into the viscous medium for a certain period of time. As a result, the rheological behaviour during ejection of a droplet may differ depending on previous events and previously ejected droplets. If the viscous medium previously was subjected to a relatively high shear rate, the resulting viscosity may for example be lower than if the viscous medium previously has been subjected to a relatively low shear rate instead.

The present inventive concept addresses these issues by allowing the time aspects to be taken into consideration when determining the control parameter. The control parameter may therefore be based on the history in terms of the time interval to the previous droplet, the size difference between the droplet to be ejected and the previous droplet, or the droplet's position in the sequence. By allowing the control parameter to be tailored to meet the individual requirements of each droplet, a better control of droplet and deposit size may be achieved, both in terms of footprint on the substrate (the spreading on the substrate may be affected by exit speed) and actual volume (the ejected volume may be determined by the actuating force and the feeding rate). According to an embodiment, the obtained control parameter may be configured to control an actuating force by which the actuator arrangement ejects the droplet. The actuating force may affect for example exit velocity of the droplet, the shear thinning of the viscous medium, or the actual volume ejected from the ejector. The choice of actuating force may be based on several different factors, some of which relating to the current rheological state of the viscous medium in the ejector, the available amount of viscous medium that can be formed into an ejected droplet, a target volume of the droplet, and a target footprint of the resulting deposit on the substrate. Examples and effects of possible actuating forces will be discussed in the following.

According to an embodiment, the obtained control parameter may be configured to reduce the actuating force compared to the actuating force used for ejecting the previous droplet in the sequence. This may be an advantage if the droplet is ejected relative shortly after the previous droplet, i.e. if it can be assumed that there is not time enough for the shear thinning that was induced during ejection of the previous droplet to be restored. In other words, if the time period is sufficiently long to allow the viscous medium to maintain, or 'remember', its reduced viscosity, it might be advantageous to adjust the actuating force accordingly.

It may also be an advantage to reduce the actuating force if the volume of previous droplet was larger, i.e., if the target size of the droplet to be ejected is smaller than the actual volume of the previous droplet. The change in droplet volume may in some examples be implemented by changing the actuating force, such that a reduced impact results in a reduced ejected amount of viscous medium. Alternatively, or additionally the volume of the droplet may be controlled by varying the feeding rate at which the viscous medium is supplied to the ejector. This may however be a relatively slow process, resulting in a delay between the change in feeding rate and a steady state delivery in droplet volume. This delay, or slow system response may be compensated by reducing the actuating force so as to achieve an ejected volume that is closer to the target volume. Thus, when going from a high feeding rate to a lower feeding rate to deliver a smaller droplet volume, this can be complemented by a reduced actuating force to achieve a more accurate volume.

Further, it may be an advantage to decrease the actuating force if the droplet is ejected early in the sequence, such as at position two or three in the sequence, or among the first five droplets in the sequence. This allows for the initial droplets in the sequence to be ejected with a higher actuating force the rest of the droplets in the sequence, which addresses an issue that sometimes is observed during the beginning of the sequence and in which the initial droplets may suffer from a too small volume.

Alternatively, the obtained control parameter may be configured to increase the actuating force compared to the actuating force used for ejecting the previous droplet in the sequence. This may for example be employed if the time period to the previous droplet is relatively long, i.e., if it can be assumed that the time period is sufficiently long to allow the viscosity to restore between the droplets. In other words, a higher actuating force may be used in case it can be assumed that the shear thinning effect that was induced during the ejection of the previous droplet has been reduced or removed and the viscous medium now exhibits a higher viscosity.

The actuating force may also be increased if the volume of the previous droplet was smaller, i.e., if the target size of the droplet to be ejected is larger than the actual volume of the previous droplet. Increasing the actuating force may cause a larger volume to be expelled from the ejector. The actuating force may also be increased in order to compensate for a volume deviation that may occur if the feeding rate is changed between the droplets, and more particularly if the feeding rate is changed from a relatively low feeding rate to a relatively high feeding rate. In this case, a delay or slow response of the ejector may be compensated by at least temporarily increasing the actuating force.

Further, it may be an advantage to increase the actuating force if the droplet is ejected early in the sequence, such as at position two or three in the sequence, or among the first five droplets in the sequence. This allows for the initial droplets in the sequence to be ejected with a lower actuating force, which addresses an issue in which the initial droplets in the sequence have been observed to have a too large volume. By increasing the actuating force later on in the sequence, the initial droplets can be ejected at a relatively low actuating force and thus with a compensated volume.

The actuator arrangement may comprise for example a piezoelectric actuator. The actuator arrangement may further comprise an impacting device for rapidly building up pressure in a chamber of the ejector by rapid movement (e.g., rapidly controlled mechanical movement) of the impacting device (e.g., the rapid movement of a plunger) over a period of time that may be longer than about a tenth of a microsecond, but, in some examples, less than about 50 microseconds, thereby providing a deformation of the medium in the chamber that forces droplets of viscous medium through a nozzle. In one implementation, a control unit applies a voltage intermittently to a piezoelectric actuator, thereby causing an intermittent extension thereof, and a reciprocating movement of the impacting device, such as a plunger or with respect to an assembly housing of the ejector.

The step of actuating the impact arrangement may comprise controlling at least one of a voltage rise time, a voltage fall time, a voltage plateau time, and a peak voltage value applied to the impact arrangement. The actuation profile may in some examples be of a trapezoidal form, or a functionalized (such as polynominal or trigonometric) form.

According to an embodiment, the obtained control parameter may be configured to control a feeding rate at which the viscous medium is supplied to the ejector. The feeding may for example be realised by means of a feeder mechanism, that may be operated according to the control parameter. The feeding rate may be controlled so as to control the amount of viscous medium that is available for the ejection of the droplet, for example in a chamber arranged between the impact device and the nozzle. The feeding rate may also have an effect on the viscosity of the viscous medium, as the feeding typically subjects the viscous medium to shearing.

In one example, the obtained control parameter may be configured to reduce the feeding rate compared to the feeding rate used when ejecting the previous droplet in the sequence. The feeding rate may be reduced in order to provide a droplet of a smaller volume.

In another example, the obtained control parameter may be configured to increase the feeding rate compared to the feeding rate used when ejecting the previous droplet in the sequence. The increased feeding rate may result in a droplet having an increase volume compared to the previous droplet.

The increase or decrease of feeding rate may be combined with a change in actuating force as well, as described in connection with the above examples.

The feeding rate may be based on a signal generated by a sensor arrangement, and may indicate a feeding rate at which the feeding mechanism supplies the viscous medium to the ejector. This allows for the feeding mechanism to be controlled based on an actual, observed feeding rate.

An ejector is typically software-controlled. Such software requires instructions for how to eject a given viscous medium onto a given substrate according to a specific jetting sequence or a sequence of a plurality of droplets. These instructions are referred to as control parameters. Thus, the control parameters instruct the ejector and support the process of ejecting viscous medium onto the substrate. This process may also be referred to as a 'jetting process' or 'printing process'. The control parameters may be generated by a pre-processing step performed offline, prior to the jetting process. The control parameters may also be generated continuously during the jetting process. The ejector may comprise a control unit, or be part of a system comprising a control unit, wherein the control unit is configured to control the actuator arrangement according to the control parameters. Further, the control unit may be capable of providing the control parameters. It is also envisioned that the control parameters may be fed to the actuator arrangement via a remote processing unit not being part of the ejector, or via a cloud interface. Similarly, it is envisioned that the control parameters may be provided by a remote processing unit not being part of the ejector, or via a cloud interface.

The term 'viscous medium' may, in the context of the present disclosure, refer to medium comprising e.g. solder paste, solder flux, adhesive, conductive adhesive, or any other kind of fluid or medium used for fastening components on a substrate, conductive ink, resistive paste, or the like. Viscous medium may also refer generally to viscous medium being ejected from a nozzle in an application where a size of the formed object of viscous medium (e.g. deposit) is of importance. Examples include food applications, construction applications, 3D printing applications, bioprinting, and medical applications; the viscous medium in such applications may e.g. be an edible material, a construction material, an ink, or a medical compound, respectively.

The term 'deposit' may, in the context of the present disclosure, refer to the material deposited onto the substrate by the ejection of viscous medium.

The term 'droplet' or 'jetted droplet' should be understood as the amount of viscous medium that is forced through a nozzle of the ejector and that is moving towards the substrate in response to the operation of the actuator arrangement. It will however be appreciated that a plurality of droplets may be ejected from the nozzle in response to a single stroke of the actuator arrangement.

The term 'size' in relation to a deposit as discussed in the present disclosure may refer to the area on a substrate that the deposit covers, e.g. defined by its diameter or footprint. An increase in the droplet volume generally results in an increase in the deposit height as well as the deposit size.

A substrate may be a work piece comprising e.g. a board (e.g. a printed circuit board (PCB), a flexible PCT or a printed wiring board (PWB), a substrate for ball grid arrays (BGA), a flexible substrate (e.g. paper), chip scale packages (CSP), quad flat packages (QFP), wafers, flip-chips, or the like. In some applications, the substrate may be a material or surface which may receive viscous medium, examples include floors, outdoor terrain, paper, cardboard, metals, glass, plastics, human or animal tissue, etc. The substrate may be a flat surface, but it is also envisioned that the substrate may form a three-dimensional surface and/or comprise irregular shapes and/or wells wherein the viscous medium is to be deposited.

The term 'target size' as discussed in the present disclosure need not necessarily refer to the actual size of a deposit formed on the substrate. In contrast, a 'target size' refers to the size desired when ejecting viscous medium onto the substrate in order to form a deposit. The target size may be proportional to a volume of viscous medium fed to the chamber of the ejector prior to ejection of the viscous medium, and/or proportional to the actuation force used during the ejection.

The term 'sequence' as discussed in the present disclosure refers to a plurality of deposits formed by a plurality of jetted droplets by the ejector in a jetting process. In one example, the sequence may be formed of a repeated ejection of droplets during a specific time period, during which viscous medium is fed to the ejector and the actuator arrangement is operated to expel the viscous medium from the ejector. This may be formed on the fly, i.e., as the ejector is moved over the substrate, or at a fixed location over the substrate. Further, a sequence of a plurality of deposits may comprise one or several sub-sequences of grouped jetted droplets.

The phrase 'ejection of a deposit' should be understood to comprise ejection of viscous fluid in order to form a deposit.

The phrase 'based on' in the context of determining the control parameters may comprise 'determined as a function of', 'proportional', 'directly proportional', and 'derived from'.

The step of obtaining the control parameter may comprise comparing a target size to a target size of a previous droplet in the sequence, and wherein the control parameter is based on the comparison. For example, the comparison between the target size of the droplet to be ejected and the target size of the previous deposit in the sequence may comprise determining a ratio between the target size to be ejected and the target size of a previous deposit in the sequence. In a case where the previous droplet was larger than the droplet to be ejected, the actuating force and/or feeding rate may be reduced accordingly. In a case where the previous droplet was smaller than the droplet to be ejected, the actuating force and/or feeding rate may be increased accordingly.

The step of providing a control parameter may comprise receiving sensor data from a sensor arrangement of the ejector, wherein the sensor data pertains to a flow rate of viscous medium into a chamber of the impact arrangement, and wherein the control parameters are further determined based on the sensor data. The sensor data may be received continuously throughout a jetting process, e.g. sensor data may be received during the ejection of viscous medium. The sensor data may pertain generally to the viscosity of the viscous medium, and/or the rheological characteristics of the viscous medium. In particular, a displacement of the actuator arrangement may be performed by analysing a response from the actuator arrangement. The actuator may e.g. be a piezoelectric actuator, which may be adapted to generate an electric response that is indicative of the movement of the impacting device and/or a mechanical load exerted on the impacting device. Thus, by monitoring an electric response from the actuator the jetting process may be evaluated in terms of e.g. pressure in the chamber and movement of the actuator arrangement expelling viscous medium through the nozzle. If the sensor data for example indicate that the ejected volume or the exit speed is lower than expected, the control parameter can be adjusted based on this information such that the actuating force and/or the feeding rate is increased. The same reasoning applies to the opposite situation, wherein a too high volume or exit speed can be compensated by reducing the actuating force and/or feeding rate.

The step of providing control parameters may be performed for every droplet in the sequence prior to the actuation of the actuator arrangement is initiated. In other words, the control parameters may be provided before the ejector has started the jetting process. In this regard, it should be noted that the sequence of plurality of droplets to be ejected may be known beforehand, e.g. the position, timing and desired size of each deposit to be formed by the droplets in the sequence may be known beforehand, and thus the control parameters may be provided by the method according to the first aspect before any deposit in the sequence has been formed.

According to a second aspect of the inventive concept, these and other objects are achieved in full, or at least in part, by a system comprising an ejector comprising an impact arrangement configured to eject a droplet of viscous medium onto a substrate, wherein the droplet forms part of a sequence of a plurality of droplets. The system further comprises a control unit configured to obtain a control parameter for controlling the operation of the actuator arrangement in order to eject the droplet, wherein the control parameter is based on at least one of: a time period between the droplet and a previous droplet in the sequence, a difference in target size of the droplet and a size of the previous droplet in the sequence, and the droplet's position in the sequence.

It will be appreciated that the disclosed inventive concept may be utilized not only for a continuous real time monitoring and controlling, but also for calibrating the ejection process before any viscous medium has been ejected. In general, the disclosed inventive concept may be utilized to optimize any given jetting process.

The present disclosure may be embodied as computer readable instructions for controlling a programmable computer in such manner that it causes an ejector or a system to perform the method according to the first aspect. Such instructions may be distributed in the form of a computer-program product comprising a non-volatile, computer-readable medium storing the instructions.

Other objectives, features and advantages of the present inventive concept will appear from the following detailed disclosure, from the attached claims as well as from the drawings.

BRIEF DESCRIPTION OF THE DRAWINGS

The above, as well as additional objects, features and advantages of the present inventive concept, will be better understood through the following illustrative and non-limiting detailed description of different embodiments of the present inventive concept, with reference to the appended drawings, wherein.

The figures are not necessarily to scale, and generally only show parts that are necessary in order to elucidate the inventive concept, wherein other parts may be omitted or merely suggested.

DETAILED DESCRIPTION

Figure 1:
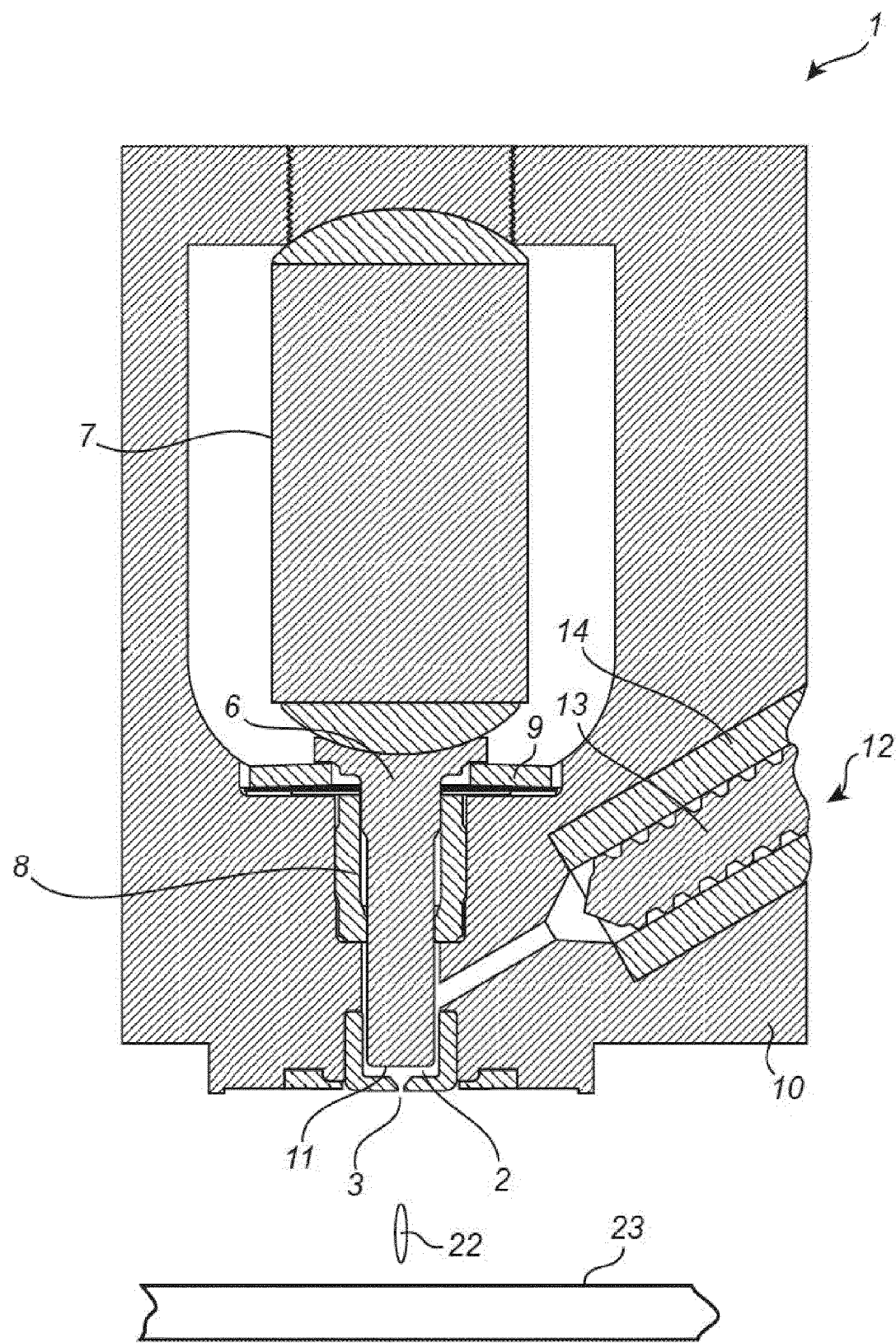
FIG. 1 schematically illustrates an ejector in a cross-sectional view.

FIG. 1 illustrates an ejector according to an implementation of the present disclosure.

The ejector 1 comprises an assembly housing 10 and an actuator arrangement, which in this implementation may include a piezoelectric actuator 7 and a plunger or piston 6 operatively connected to the piezoelectric actuator 7. The plunger 6 may be axially moveable while slideably extending through a bore hole in a bushing 8. Cup springs 9 may be provided to resiliently balance the plunger 6 against the assembly housing 10, and for providing a preload for the piezoelectric actuator 7. An ejector control unit (not shown) may apply a drive voltage intermittently to the piezoelectric actuator 7, thereby causing an intermittent extension thereof, and hence a reciprocating movement of the plunger 6 with respect to the assembly housing 10, in accordance with control parameters, e.g. solder pattern printing data.

Furthermore, the ejector 1 may comprise nozzle 2, which may be operatively directed towards a substrate 23 onto which droplets 22 of viscous medium are to be jetted. The nozzle 2 may according to the present embodiment comprise a nozzle space 3 and a nozzle outlet 4 through which the droplets 22 are jetted towards the substrate 23. The nozzle outlet 4 may be located at one end, such as a lower portion, of the nozzle 2.

A chamber 5 may be defined between an end surface 11 of the plunger 6 and the nozzle 2. Axial movement of the plunger 6 towards the nozzle 2 may cause a rapid decrease in the volume of the chamber 5. Such an impact by the plunger 6 may thus cause a rapid pressurization and jetting of viscous medium through the nozzle outlet 4.

In other implementations of the technology disclosed using a different type of ejector, the plunger comprising a piston may be replaced by another type of actuator arrangement device such as e.g. a membrane or diaphragm.

The actuator arrangements may be configured to provide for a non-contact jetting process to form and shoot droplets of a viscous medium from a jetting nozzle onto a substrate by quickly generating a pressure impulse by the reciprocating, or vibrating movement of the impacting device.

The actuator arrangement, and in particular the plunger 6, may move from a starting position towards an end position during a time period of about 1 to 50 microseconds in order to shoot individual droplets having a deposit volume between about 0.1 nanolitres and 100 nanolitres, such as e.g. 1 to 5 nanolitres, 5 to 15 nanolitres, 10 to 20 nanolitres, 30 to 40 nanolitres, or 40 to 50 nanolitres. The speed of the actuator arrangement for impacting the nozzle with a pressure impulse may be between about 5 m/s and about 50 m/s.

Viscous medium may be supplied to the nozzle space 3 from a supply container (not shown), via the feeding channel of a feeder 12. The feeder 12 may comprise an electric motor (not shown) having a motor shaft 13 partly provided in a tubular bore that extends through the ejector housing 10 to an outlet port communicating with the chamber 5 via a channel. At least a portion of the rotatable motor shaft, or feed screw 13 may be surrounded by a tube 14 made of an elastomer or the like arranged coaxially therewith in the tubular bore, wherein the threads of the rotatable feed screw 13 may be in sliding contact with the innermost surface of the tube. Viscous medium captured between the threads of the feed screw 13 and the inner surface may then be forced towards the chamber 5 in accordance with the rotational movement of the feed screw 13.

Figure 2A:
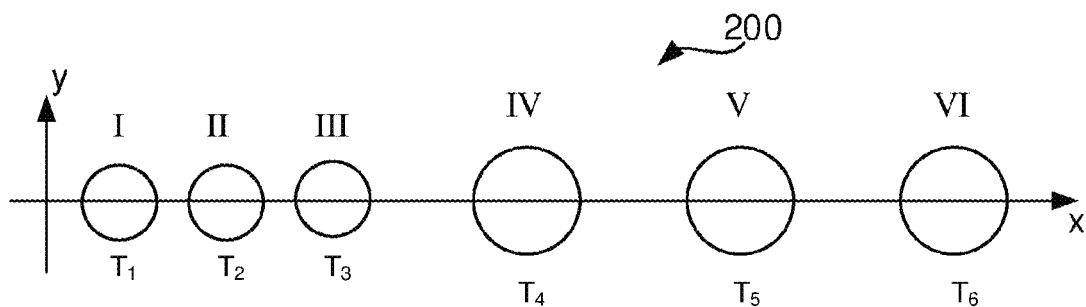
FIG. 2a illustrates a sequence of deposits in time and space.

Referring now to FIG. 2a, a sequence 200 of a plurality of deposits I-VI is shown in a diagram wherein the spatial distribution of the deposits is shown along two axes x and y. Each deposit in the sequence 200 is formed by a droplet ejected in a corresponding sequence. The deposits I-VI are hence associated with a time of ejection $T_1$-$T_6$ respectively. The time of ejection may be defined as a single point in time pertaining to the ejection of viscous fluid in a droplet forming a specific deposit. It is preferred if the time of ejection is defined coherently for all deposits in the sequence 200 so as to allow a precise and consistent determination of a time period between any of the deposits in the sequence. In other words, an event representing the time of ejection may be arbitrarily defined, as long as the time of ejection (and thus the event representing the time of ejection) is defined consistently throughout the plurality of deposits. For example, the time of ejection may be defined as the onset of voltage used to actuate the actuator arrangement for ejecting viscous fluid. As can be seen, the first three deposits in the sequence 200, having a sequence position I, II, and III respectively, are of a first size, while the following three deposits IV, V, and VI, respectively, are of a second, larger size. In the illustrated example, the illustrated sizes of the deposits are equal to the target sizes of the respective deposits. The target sizes may be known before starting the jetting process and forming any of the deposits.

Figure 2B:
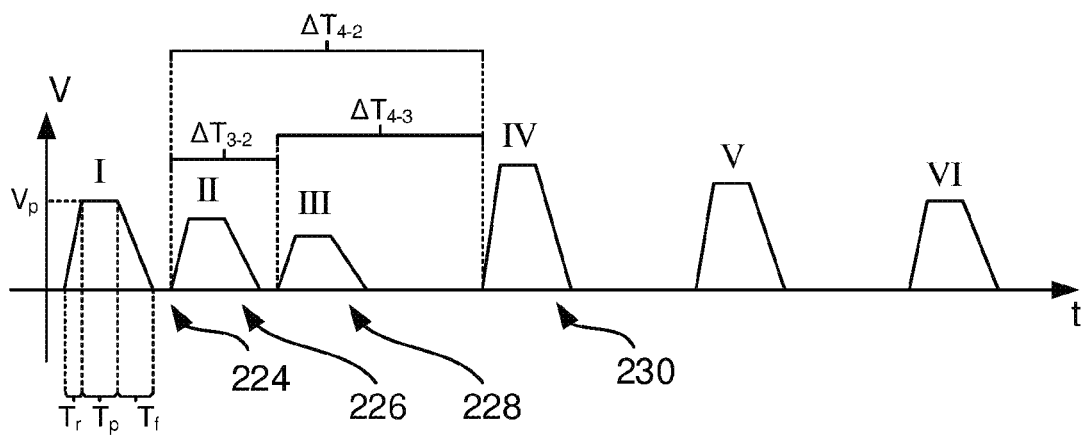
FIG. 2b illustrates control parameters for a sequence of droplets as a function of time.

Referring now to FIG. 2b, a diagram illustrating control parameters corresponding to the sequence of deposits illustrated in FIG. 2a is shown. The control parameters here pertain to a voltage applied to the actuator arrangement of the ejector. It should be noted that the illustrated figure merely depicts an example, and that the applied voltage is not restricted to trapezoid shaped onsets. The first deposit I is formed by actuating the actuator arrangement using control parameters 224 comprising information pertaining to a peak voltage value $V_p$, a voltage rise time $T_r$, a voltage plateau time $T_p$, and a voltage fall time $T_f$. Hereby, the desired size of the first deposit I may be achieved. The peak voltage value $V_p$, the voltage rise time $T_r$, the voltage plateau time $T_p$, and the voltage fall time $T_f$ may be comprised in an actuation profile. It is to be understood that the actuation profile is not limited to the above specified parameters pertaining to the voltage applied to the impact arrangement. Other types of actuation profiles are possible for controlling an actuator arrangement, and the control parameters may comprise information pertaining to such other types of actuation profiles. For example, the actuation profile may comprise several voltage increases, decreases, and/or plateaus, and the control parameters may consequently comprise information pertaining to several peak voltage values, voltage rise times, voltage plateau times, and/or voltage fall times.

Moving on to the second deposit II and the third deposit III in the sequence, the times of ejection $T_2$ and $T_3$ of the droplets forming deposits II and III respectively are here defined as the onset of voltage applied to the actuator arrangement for ejecting viscous fluid. As is readily appreciated by the person skilled in the art, other definitions of a time of ejection of a droplet are possible within the scope of the present inventive concept. As already discussed it is however preferable if the time of ejection for each droplet is defined equally for each droplet in the sequence so as to achieve a true and consistent representation of the events pertaining to the forming of the plurality of droplets in the sequence. The time of ejection of viscous fluid droplets forming the deposits I-VI in the sequence may be known beforehand.

The control parameters 230 used to actuate the actuator arrangement in order to form the fourth deposit IV may in the illustrated example be based on a time period $T4_{4-3}$ between the deposit IV and the previous deposit III, and/or on a time period $T4_{4-2}$ between the deposit IV and the previous deposit II, and/or more generally, on a time period $T_{4-y}$ between the deposit IV and a previous deposit Y.

In addition, or alternatively, the control parameters 230 used to actuate the actuator arrangement in order to form the fourth deposit IV may in the illustrated example be based on a target size of the previous deposit III, and/or a target size of the previous deposit II, and/or more generally on the target size of a previous deposit Y in the sequence.

In addition, or alternatively, the control parameters 230 used to actuate the actuator arrangement in order to form the fourth deposit IV may in the illustrated example be based on a position of the previous deposit III in the sequence, i.e. position III, and/or a position of the previous deposit II, i.e. position II, and/or more generally on the position of a previous deposit Y in the sequence, i.e. position Y.

Figure 3:
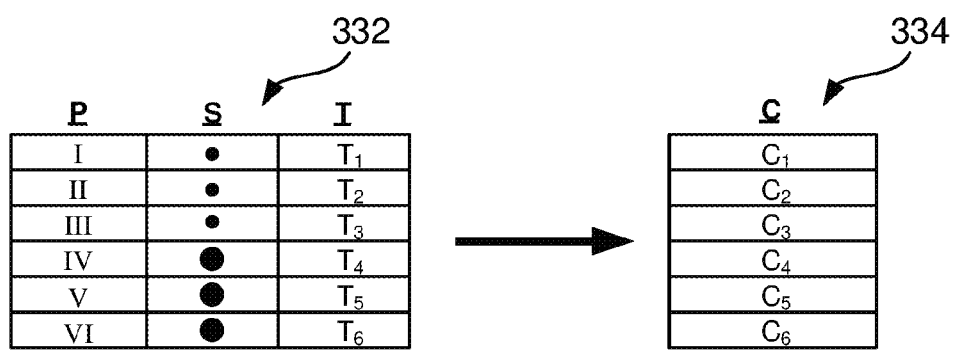
FIG. 3 illustrates a relationship between control parameters, and sequence position, target size, and time.

Briefly referring to FIG. 3, the position, size, and time of ejection of a plurality of droplets in a sequence are illustrated in a table 332. The information comprised in the table 332 may, as already discussed, be known before the jetting process is initiated. Based on such information, control parameters pertaining to each of the deposits in the sequence to be formed may be provided, as conveyed by the arrow in the illustrated figure and the table of control parameters 334.

Referring again to FIG. 2, as can be seen, the control parameters 224, 226, 228 used to actuate the actuator arrangement in order to form each of the droplets forming deposits I, II and III are different despite the target size of the deposits I, II and II being the same. In particular, the control parameters 224, 226, 228 pertaining to the droplets forming each of the deposits I, II and III, respectively, are not merely determined by the target size of the respective deposits I, II and III. In contrast, the control parameters 224, 226, 228 pertaining to the deposits I, II and III, respectively, are adapted to each of the deposits I, II and III respectively based on at least one previous deposit, e.g. a time period between the deposit and a previous deposit in the sequence, and/or based on a target size of a previous deposit in the sequence, and/or based on a position of the deposit in the sequence.

Figure 4:
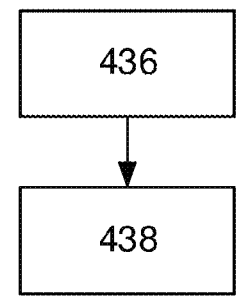
FIG. 4 illustrates a method for controlling an ejector in a block diagram.

A method for controlling an ejector according to the inventive concept will now be described with reference to FIG. 4.

The method comprises, at block 436, the step of obtaining one or more control parameters for controlling the operation of the actuator arrangement, wherein the one or more control parameters are based on at least one of a time period between the droplet and a previous droplet in the sequence, a different in target size of the droplet and a size of the previous droplet in the sequence, and the droplet's position in the sequence. The method further comprises, at block 438, the step of operating the actuator arrangement using the control parameter in order to eject the droplet.

As outlined above, the method may be embodied as computer-executable instructions distributed and used in the form of a computer program product including a computer-readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media typically embodies computer readable instructions, data structures, program modules or other data in a modulated data signal such as a carrier wave or other transport mechanism and includes any information delivery media.

The model used to compensate the actuation used for the individual droplets can be based on first principles concerning the flow of material through the device.

The model used to compensate the actuation can be improved by the implementation of a machine-learning strategy utilising for example neural networks or generative adversarial networks (GAN). The quantified result of the actuation in the form of deposit diameters, volumes, satellite levels, shape or any other related descriptive property is used together with the implemented actuation parameters to continuously improve the model-based compensation.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

LIST OF REFERENCE SIGNS

1 Ejector
2 Nozzle
3 Nozzle space
5 Chamber
6 Plunger
7 Actuator
8 Bushing
9 Cup springs
10 Housing
11 End surface
12 Feeder
13 Feed screw
14 Tube
22 Droplet
23 Substrate
200 Sequence
224 Control parameters
226 Control parameters
228 Control parameters
230 Control parameters
332 Table of position, size, time of ejection
334 Table of control parameters
436 Step of providing control parameters
438 Step of actuating impact arrangement

The invention claimed is:

1. A method for controlling an ejector comprising an actuator arrangement configured to eject a droplet of a plurality of droplets of viscous medium onto a substrate, wherein the droplet forms part of a sequence of the plurality of droplets, the method comprising:
obtaining a control parameter for controlling an operation of the actuator arrangement; and
operating the actuator arrangement, using the control parameter, in order to form and eject the droplet,
wherein the obtained control parameter is based on at least one of:
a time period between the droplet and a previous droplet in the sequence,
a difference in target size of the droplet and a size of the previous droplet in the sequence, and
the droplet's position in the sequence.

2. The method according to claim 1, wherein the obtained control parameter is configured to control an actuating force by which the actuator arrangement ejects the droplet.

3. The method according to claim 2, wherein the obtained control parameter is configured to reduce the actuating force compared to the actuating force used for ejecting the previous droplet in the sequence.

4. The method according to claim 2, wherein the obtained control parameter is configured to increase the actuating force compared to the actuating force used for ejecting the previous droplet in the sequence.

5. The method according to claim 1, wherein the actuator arrangement is operable by means of an applied voltage signal, and wherein the step of operating the actuator arrangement comprises controlling at least one of a voltage rise time, a voltage fall time, a voltage plateau time, and a peak voltage value of the applied voltage signal.

6. The method according to claim 1, wherein the obtained control parameter is further configured to control a feeding rate at which the viscous medium is supplied to the ejector.

7. The method according to claim 6, wherein the obtained control parameter is configured to reduce the feeding rate compared to the feeding rate used when ejecting the previous droplet in the sequence.

8. The method according to claim 6, wherein the obtained control parameter is configured to increase the feeding rate compared to the feeding rate used when ejecting the previous droplet in the sequence.

9. The method according to claim 6, wherein the control parameter is further based on sensor data from a sensor arrangement of the ejector, wherein the sensor data pertains to a flow rate of viscous medium into the ejector.

10. The method according to claim 1, wherein the viscous medium is a solder paste.

11. The method according to claim 1, wherein the step of obtaining the control parameter is performed for every droplet in the sequence before performing the step of operating the actuator arrangement.

12. A system comprising:
the ejector comprising the actuator arrangement configured to eject the droplet of the plurality of droplets of the viscous medium onto the substrate, wherein the droplet forms part of the sequence of the plurality of droplets; and
a control unit configured to control the ejector to eject the droplet of the viscous medium onto the substrate based on the control unit performing the method of claim 1.

13. The system according to claim 12, wherein the actuator arrangement is a piezoelectric actuator.

14. The system according to claim 12, further comprising a feeding mechanism arranged to supply the viscous medium to the ejector, wherein the feeding mechanism is controllable by the control unit.

15. The system according to claim 14, further comprising a sensor arrangement for generating a signal indicating a feeding rate at which the feeding mechanism supplies the viscous medium to the ejector, wherein the control unit is configured to control the feeding mechanism based on the signal.

\* \* \* \* \*